United States Patent [19]

Etzbach et al.

[11] Patent Number: 5,393,645

[45] Date of Patent: Feb. 28, 1995

[54] PRODUCTION OF STRUCTURED POLYMER LAYERS HAVING NONLINEAR OPTICAL PROPERTIES

[75] Inventors: Karl-Heinz Etzbach, Frankenthal; Heike Kilburg, Speyer; Hans-Joachim Lorkowski; Karl Pfeiffer, both of Berlin, all of Germany

[73] Assignee: BASF Aktiengesellschaft, Ludwigshafen, Germany

[21] Appl. No.: 167,064

[22] Filed: Dec. 16, 1993

[30] Foreign Application Priority Data

Dec. 24, 1992 [DE] Germany .................. 4244195

[51] Int. Cl.$^6$ ................................ G02F 1/35
[52] U.S. Cl. .................... 430/288; 526/232.1; 526/258; 526/259; 526/273; 526/318; 526/318.1; 526/318.2; 526/329; 526/329.7; 430/281; 430/286; 430/297; 430/298; 430/321; 430/328; 430/330; 522/1; 522/102; 522/103
[58] Field of Search .............. 526/232.1, 258, 259, 526/273, 318, 318.1, 318.2, 329, 329.7; 430/281, 286, 288, 297, 321, 298, 328, 330; 522/1, 102, 103

[56] References Cited

U.S. PATENT DOCUMENTS 5,189,134 2/1993 Mignani et al. .................. 528/68

FOREIGN PATENT DOCUMENTS

| 313475 | 4/1989 | European Pat. Off. |
| 89/08686 | 9/1989 | WIPO |
| 91/03683 | 3/1991 | WIPO |
| 92/22593 | 12/1992 | WIPO |
| 93/02384 | 2/1993 | WIPO |

OTHER PUBLICATIONS

Cross-linked stable second-order nonlinear . . . Mandal et al., Appl. Phys. Lett. 56 (22), 3 Jun. 1991, pp. 2459–2463.
Novel Photo-Crosslinked Nonlinear Optical Polymers, Mandal et al. Makromol. Chem., Rapid Commun. 12, 63–68 (1991).
Novel Second-Order Nonlinear Optical Polymers . . . Eich et al., J. Appl. Phys. 66 (7), Oct. 1989, 3241.
Highly Efficient and Stable Nonlinear Optical Polymers . . . , Reck et al., Appl. Phys. Lett 58 (26), 25 Jun. 1990, 2610.

*Primary Examiner*—Samuel A. Acquah
*Attorney, Agent, or Firm*—Keil & Weinkauf

[57] ABSTRACT

Structured polymer layers having nonlinear optical properties are produced by a process wherein either organic compounds containing ethylenically unsaturated groups are subjected to free radical copolymerization (A) with stilbene, azo or azomethine compounds containing ethylenically unsaturated groups and donor and acceptor groups, or organic compounds containing ethylenically unsaturated groups are subjected to free radical polymerization and are mixed (B) with stilbene, azo or azomethine compounds containing ethylenically unsaturated groups and donor and acceptor groups, the copolymers (A) or mixtures (B) thus obtained are exposed imagewise to high-energy radiation, the unexposed parts are removed and the structured polymer layers thus obtained are polarized in an electric field for orientation of the chromophoric structural units in the region of the glass transition temperature of the polymer and crosslinked in an applied electric field.

Such structured polymer layers are suitable for the production of polymeric waveguides in communications technology.

8 Claims, No Drawings

PRODUCTION OF STRUCTURED POLYMER LAYERS HAVING NONLINEAR OPTICAL PROPERTIES

The present invention relates to a process for the production of structured polymer layers having nonlinear optical properties by imagewise exposure of the layer to high-energy radiation, subsequent development of the structure, electrical polarization and crosslinking.

It is known that materials which exhibit nonlinear optical properties have a dielectric susceptibility dependent on the field strength. Organic polymers acquire these properties as a result of the polarization of hyperpolarizable structural elements in an electric field. The currently known organic polymer materials exhibit unsatisfactory nonlinear optical properties and do not meet the set requirements. This applies in particular to the stability of the properties, which has been insufficient to date. To reduce the relaxation of the oriented state of chromophoric structures which is achievable by polarization, photochemical crosslinking is used, photosensitive chromophoric structural elements being photochemically crosslinked by means of UV radiation (cf. B. K. Mandal et al., Appl. Phys. Letters 58 (1991), 2459, Makromol. Chem. Rapid Commun. 12 (1991), 63). By separation of the two processes, orientation of chromphoric structures in an electric field in the region of the glass transition temperature of the polymer system and separate crosslinking, a higher degree of orientation is achieved in substantially shorter polarization times in an electric field than in the case of a simultaneous process, as is the case, for example, with a prepolymer of bifunctional epoxide monomers and aromatic, chromophoric amines (cf. M. Eich et al., J. Appl. Phys. 66 (1989), 3241, D. Jungbauer et al., Phys. Letters 56 (1990), 2610, or EP-0313475-A2). The main disadvantages of these procedures is that, in the first case, long UV exposure times are required in order to achieve a high degree of crosslinking for reducing the relaxation of the oriented state, with the result that the chromophoric structural unit is destroyed to a greater or lesser extent, and, in the thermal crosslinking in the second case, very long polarization times are required and monitoring of the process is made more difficult by the constantly changing structure during the polarization. In addition, a structurable polymer layer cannot be realized by this procedure.

It is an object of the present invention to provide a process for the production of a nonlinear optical polymer layer, in which orientation of the hyperpolarizable structural elements in the polymer during polarization in the electric field is not hindered by crosslinking, and the orientation state achieved can be stabilized and structured by chemical crosslinking by means of radiation.

We have found that this object is achieved, according to the invention, if a radiation-sensitive polymer layer which contains hyperpolarizable structural units is exposed imagewise to high-energy radiation, the unexposed parts are removed, orientation of the hyperpolarizable structural units, which are either in doped form, i.e. as a component of a mixture, or covalently bonded in the polymer matrix, is then carried out in an electric field and crosslinking is then effected.

The present invention relates to a process for the production of structured polymer layers having nonlinear optical properties, wherein either organic compounds containing ethylenically unsaturated groups are subjected to free radical copolymerization (A) with stilbene, azo or azomethine compounds containing ethylenically unsaturated groups and donor and acceptor groups, or organic compounds containing ethylenically unsaturated groups are subjected to free radical polymerization and are mixed (B) with stilbene, azo or azomethine compounds containing ethylenically unsaturated groups and donor and acceptor groups, the copolymers (A) or mixtures (B) thus obtained are exposed imagewise to high-energy radiation, the unexposed parts are removed and the structured polymer layers thus obtained are polarized in an electric field for orientation of the chromophoric structural units in the region of the glass transition temperature of the polymer and crosslinked in an applied electric field.

For example, electron, X-ray or ionic radiation can be used as the high-energy radiation for this purpose.

Glycidyl methacrylate or polyfunctional aromatic diallyl esters, in particular diallyl benzenedicarboxylate, are preferably used for the preparation of the copolymers (A) or of the mixtures (B).

The removal of the unexposed parts after the imagewise exposure is preferably effected by dissolution with an organic solvent and removal of residual solvent.

It is also possible that the crosslinking is effected chemically by radiation in an applied electric field.

The present invention furthermore relates to a process for the further processing of structured polymer layers having nonlinear optical properties to give optical waveguides, wherein the structured polymer layers produced according to the invention are leveled before or after the polarization in the electric field and crosslinking by application of a copolymer of methyl methacrylate and methacrylic acid, the methacrylic acid content in the copolymer being >30 mol %.

The nonlinear optical behavior of the polymer layers produced according to the invention has a number of effects which are of considerable interest in terms of applications for components in integrated optics, such as optical waveguides and electrooptical modulators, so that the structured polymer layers produced according to the invention and having nonlinear optical properties can be used for the production of polymeric waveguides in communications technology, optoelectronics and optical signal processing.

Regarding the process according to the invention, the following may be stated specifically.

For the novel process, both organic compounds containing ethylenically unsaturated groups, for example acrylate or methacrylate compounds, preferably polyfunctional acrylate or methacrylate compounds, such as glycidyl acrylate or, in particular, glycidyl methacrylate, or polyfunctional ethylenically unsaturated aromatic compounds, for example diallyl phthalate, isophthalate or terephthalate, can be subjected to free radical copolymerization with stilbene, azo or azomethine compounds containing ethylenically unsaturated groups and donor and acceptor groups, i.e. ethylenically unsaturated chromophoric compounds, for example such (meth)acrylates carrying chromophoric groups (=A), and doped polymer matrices (=B) may be used, i.e. mixtures of homo- or copolymers of ethylenically unsaturated organic compounds, such as (meth)acrylate homo- or copolymers, for example of allyl methacrylate and/or glycidyl methacrylate, or prepolymers of ethylenically unsaturated aromatic comopunds, such as those based on polyfunctional aromatic allyl esters, for example based on diallyl phthalate, isophthalate and/or terephthalate, with chromophoric compounds containing ethylenically unsaturated groups and donor and acceptor groups and selected from the group consisting of the stilbene, azo or azomethine compounds.

The homo- or copolymers stated as preferred examples and based on glycidyl methacrylate (PGMA) or polyfunctional aromatic prepolymers based on diallyl phthalate, isophthalate and terephthalate thus have chromophoric structural units as a result of doping or copolymerization.

Because the polymers used are highly sensitive to electron beams and X-rays, only a low radiation dose is required to achieve the solubility change necessary for structuring. On doping with up to 15% by weight of chromophores having an extended $\pi$ electron system, for example unsubstituted and substituted stilbenes, azo compounds and azomethines having donor (dialkylamino) and acceptor ($NO_2$) groups, >80% of the initial layer are obtained at an electron radiation dose of <10 $\mu C/cm^2$ (20 keV) in the case of polyglycidyl methacrylates and <50 $\mu C/cm^2$ (20 keV) in the case of polydiallyl phthalate (PDAP) as host polymer when structure development is effected with methyl ethyl ketone or methyl isobutyl ketone. The same result is obtained for a copolymer of 30% by weight of a chromophoric azo compound and 70% by weight of glycidyl methacrylate.

In principle, a very wide range of hyperpolarizable compounds can be used. It is essential that these compounds have very good compatibility with the polymer matrix on doping or exhibit good copolymerization behavior. With respect to polymerizable chromophoric compounds, glycidyl methacrylate generally has a better tendency to copolymerize than the diallyl esters of the isomeric benzenedicarboxylic acids. The prepolymers of the aromatic diallyl esters prove more advantageous with regard to doping. This is due to the comparable aromatic structure and to the fact that the molecular weight of the aromatic prepolymers is an order of magnitude lower. The latter permits the production of greater layer thicknesses (>1 $\mu m$) by simple coating.

Examples of ethylenically unsaturated compounds containing azo chromophores include

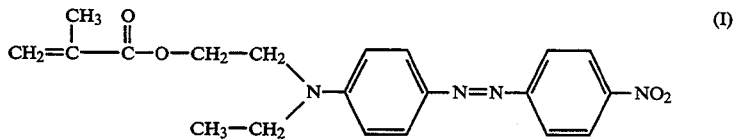

(I)

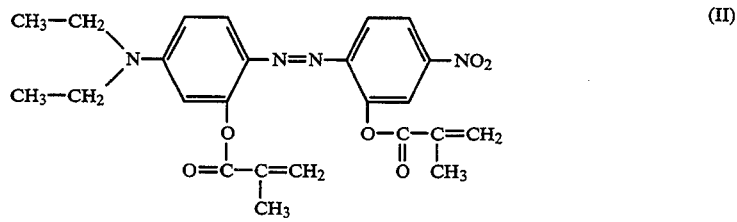

(II)

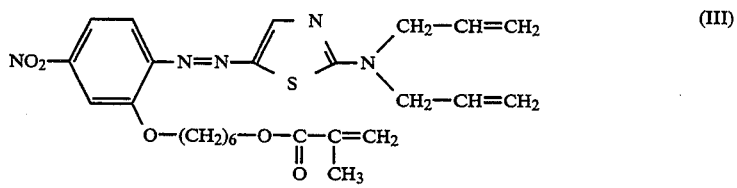

(III)

The free radical homo- or copolymerization of the ethylenically unsaturated compounds is carried out in a conventional manner, for example in the presence of polymerization catalysts providing free radicals, such as azobisisobutyronitrile (=ABIN) or benzoyl peroxide, if necessary in suitable organic solvents, such as ketones, e.g. acetone or methyl ethyl ketone, preferably in an inert gas atmosphere, e.g. $N_2$ or argon, at from 60 to 80° C. The homo- or copolymers obtained can be purified in a conventional manner, such as by precipitation from their solutions, for example by precipitating from their acetonic solutions once or several times with methanol.

To continue the novel process, the copolymers (A) or the mixtures (B) are dissolved, for example in an organic solvent, such as cyclohexanone or ethylglycol acetate, filtered through a filter having a pore size of about 0.2 $\mu m$ and applied to a suitable substrate by spin coating (at about 500 to 3,000 rpm) and the solvent is removed. Suitable substrates are conventional substrate materials, for example glass, quartz, ITO substrates and metal. The substrates coated in this manner are then exposed imagewise to high energy radiation, for example to electron beams (energy from 5 to 50 keV or dose from 5 to 100 $\mu C/cm^2$), for example with the use of a chromium mask. Development is then carried out, i.e. the unexposed parts are removed by means of an organic solvent, for example with methyl ethyl ketone, and a brief thermal treatment, for example from 50° to 100° C., or drying is effected.

The structured polymer layers obtained in this manner are polarized in an electric field, for example using a dc voltage field, in order to orient the chromophoric structural units in the region of the glass transition temperature, and are crosslinked in the applied electric field, preferably chemically crosslinked by radiation, for example by electron beams.

Polymers which have a solubility differing from that of the structured polymer are suitable for leveling or embedding the structures produced. A copolymer of methyl methacrylate and >30, for example 25 to 60, preferably from 30 to 50, % by weight of methacrylic acid proved advantageous. This copolymer is soluble in alcoholic solvents and has excellent transparency and adhesive strength and a high glass transition temperature.

The Examples which follow illustrate the principle of the invention for 3 different compounds containing azo chromophores.

EXAMPLE 1

20 g of glycidyl methacrylate are dissolved in 120 g of acetone and the solution is refluxed under an inert gas atmosphere for 12 hours in the presence of 0.5% by weight, based on glycidyl methacrylate, of azobisisobutyronitrile. Thereafter, the polymer is precipitated from 315 g of methanol and is purified by repeated dissolution in acetone and precipitation with methanol. The purified polymer is dissolved in 50 g of cyclohexanone without being dried, the residual solvents methanol and acetone are removed by distillation under reduced pressure and the solution of the polymer in cyclohexanone is filtered through a 0.2 μm pressure filter. (Polymer content of the solution 18% by weight; molecular weight Mw=78,000; Mn=40,000; Mw/Mn=1.95, Tg=66° C.) 10% by weight, based on the polymer, of the chromophoric compound (I), (II) or (III) are added to 10 g of the solution, and the resulting solution is filtered through a 0.2 μm pressure filter and is used for spin coating (1,500 rpm) glass substrates.

The substrates coated in this manner are then exposed imagewise to electron beams, and the structure incorporated by exposure is developed for 30–50 sec in methyl ethyl ketone and treated thermally at 60° C. under reduced pressure.

| Chromophore | Layer thickness nm | Dose C/cm$^2$ | Remaining layer % |
|---|---|---|---|
| (I) | 1250 | $1 \times 10^{-5}$ | 82 |
| (II) | 1050 | $8 \times 10^{-6}$ | 78 |
| (III) | 1270 | $9 \times 10^{-6}$ | 85 |

EXAMPLE 2

20 g of an isomeric diallyl benzenedicarboxylate (diallyl phthalate, isophthalate and terephthalate) are polymerized in the presence of 1% of benzoyl peroxide under nitrogen at 80° C. to give a branched prepolymer which is still soluble. The prepolymer is separated from the monomers still present by dissolution in 160 g of acetone and subsequent precipitation with 240 g of methanol. The prepolymer is purified by repeated dissolution in acetone and precipitation with methanol and is dried at 60° C.

| Prepolymer | Conversion % | IN[2] | —C=C monomer unit[3] | Tg °C. Prepolymer | Tg/°C.[4] |
|---|---|---|---|---|---|
| PDAP | 21 | 55 | 1.4 | 63 | 95 |
| PDAIP | 15 | 81 | 1.2 | 74 | 105 |
| PDATP | 13 | 80 | 1.2 | 106 | 130 |
| PDATP/AMTP[1] | 14 | | 1.3 | 57 | 103 |

[1])Copolymer of diallyl terephthalate and methyl terephthalate (84/16% by weight)
[2])Iodine number (amount of iodine in g/100 g of polymer)
[3])Conversion of double bonds per monomer unit
[4])Tg = glass transition temperature after thermal treatment (1 h at 80° C.)

5 g of a prepolymer (PDATP are dissolved in 20 g of cyclohexanone, and 10% by weight, based on the polymer content, of a chromophoric compound (I), (II) or (III) are added and the solution is filtered through a 0.5 μm pressure filter and used in this form for spin coating (1,500 rpm) substrates. The coated substrates are then exposed imagewise to electron beams and the structure incorporated by exposure is developed in the course of 15–30 seconds in methyl ethyl ketone.

| Chromophore | Layer thickness nm | Dose C/cm$^2$ | Remaining layer % |
|---|---|---|---|
| (I) | 1520 | $8 \times 10^{-5}$ | 75 |
| (II) | 1620 | $6 \times 10^{-5}$ | 82 |
| (III) | 1830 | $5 \times 10^{-5}$ | 85 |

EXAMPLE 3

10 g of a monomer mixture comprising 8.4 g of diallyl terephthalate, 1.6 g of allyl methyl terephthalate and 0.5 g of 4-(N-2-methacryloxyethyl-N-ethyl)-amino-4'-nitroazobenzene (I) are treated in the presence of 0.3 g of dibenzoyl peroxide for 8 hours at 60° C. under an inert gas atmosphere. After cooling, the prepolymer is precipitated with 160 g of methanol, purified by repeated dissolution in acetone and precipitation with methanol and dried at 60° C. under reduced pressure for 3 hours. The prepolymer is soluble in tetrahydrofuran, cyclohexanone and ethylglycol acetate and contains 3.95% by weight of the azo monomer ($\lambda_{max}$ in THF at 455 nm, Tg 50° C.). The preparation of a prepolymer with 0.5 g of 2,2'-bis-(methacryloxy)-4-diethylamino-4'-nitroazobenzene (II) is carried out under similar conditions. The prepolymer contains 12.5% by weight of the azo monomer ($\lambda_{max}$ in THF 472 nm; Tg 50° C.).

EXAMPLE 4

2 g of glycidyl methacrylate and 200 mg of the chromophoric azo monomer (III) are dissolved in 40 g of acetone, 22 mg of azobisisobutyronitrile (ABIN) are added and polymerization is then carried out for 20 hours under reflux under a nitrogen atmosphere. After the addition of a further 22 mg of ABIN, the polymerization is continued for a further 15 hours. The deep dark blue polymer is precipitated with diethyl ether. The polymer is obtained in a yield of 85% by repeated dissolution in acetone and precipitation with ether. Elemental analysis gives a copolymerization ratio of 90:10% by weight and the Tg is 77° C.

EXAMPLE 5

5 g of the copolymers prepared according to Example 3 or Example 4 are dissolved in 25 g of cyclohexanone and, after filtration through a 0.5 μm pressure filter, are used for coating ITO substrates (ITO=indium tin oxide) (5×5 cm). After imagewise exposure to electrons (1.0 μm structures), the structures incorporated by exposure are developed with methyl ethyl ketone. The structures obtained are polarized in an electric field for 10–15 min at 10 kV and 50° C. in the case of the copolymer prepared according to Example 3 at 80° C. in the case of the copolymer prepared according to Example 4 and are crosslinked by increasing the temperature to 180° C. in an applied electric field.

| Copolymer | Layer thickness [nm] | Dose μC/cm$^2$ | Remaining layer % |
|---|---|---|---|
| Example 3 | 1280 | 60 | 65 |
| Example 4 | 1150 | 20 | 78 |

EXAMPLE 6

Leveling of the structures produced according to Example 5 before the polarization in the electric field is carried out using a copolymer of methyl methacrylate and methacrylic acid (composition: 66:34 mol %, Mw=128,000; Mn=62,000; Mw/Mn=1.5; Tg=78° C.; solvent: methylglycol; polymer content 10%). A layer thickness of 1,500 nm is obtained by spin coating at 1,500 rpm, by coating the developed structures on the substrate with a solution of the copolymer in methylglycol and carrying out the thermal treatment for 1 hour at 80° C. under reduced pressure.

EXAMPLE 7

The polymer layers produced according to Examples 1–4 on substrates are subjected to electrical polarization in the region of the glass transition temperature of the polymer system and then crosslinked by uniform or imagewise exposure to electron radiation in a dose of $>100$ $\mu C/cm^2$.

Guest/host systems (Example 1) 200 $\mu C/cm^2$
Guest/host systems (Example 2) 800 $\mu C/cm^2$
Copolymer systems (Example 3) 600 $\mu C/cm^2$
Copolymer systems (Example 4) 300 $\mu C/cm^2$

We claim:

1. A process for the production of structured polymer layers having nonlinear optical properties, wherein either organic compounds containing ethylenically unsaturated groups are subjected to free radical copolymerization (A) with stilbene, azo or azomethine compounds containing ethylenically unsaturated groups and donor and acceptor groups, or organic compounds containing ethylenically unsaturated groups are subjected to free radical polymerization and are mixed (B) with stilbene, azo or azomethine compounds containing ethylenically unsaturated groups and donor and acceptor groups, the copolymers (A) or mixtures (B) thus obtained are exposed imagewise to high-energy radiation, the unexposed parts are removed and the structured polymer layers thus obtained are polarized in an electric field for orientation of the chromophoric structural units in the region of the glass transition temperature of the polymer and crosslinked in an applied electric field.

2. A process as claimed in claim 1, wherein electron radiation, X-radiation or ion radiation is used as the high-energy radiation.

3. A process as claimed in claim 1, wherein glycidyl methacrylate or diallyl benzenedicarboxylate is used for the preparation of the copolymers (A) or of the mixtures (B).

4. A process as claimed in claim 1, wherein the crosslinking is effected chemically by radiation in an applied electric field.

5. A process for the further processing of structured polymer layers having nonlinear optical properties to give optical waveguides, wherein the structured polymer layers produced by a process as claimed in claim 1 are leveled, before or after the polarization in the electric field and crosslinking, by applying a copolymer of methyl methacrylate and methacrylic acid, the methacrylic acid content of the copolymer being $>30$ mol %.

6. A process for the further processing of structured polymer layers having nonlinear optical properties to give optical waveguides, wherean the structured polymer layers produced by a process as claimed in claim 2 are leveled, before or after the polarization in the electric field and crosslinking, by applying a copolymer of methyl methacrylate and methacrylic acid, the methacrylic acid content of the copolymer being $>30$ mol %.

7. A process for the further processing of structured polymer layers having nonlinear optical properties to give optical waveguides, wherein the structured polymer layers produced by a process as claimed in claim 3 are leveled, before or after the polarization in the electric field and crosslinking, by applying a copolymer of methyl methacrylate and methacrylic acid, the methacrylic acid content of the copolymer being $>30$ mol %.

8. A process for the further processing of structured polymer layers having nonlinear optical properties to give optical waveguides, wherein the structured polymer layers produced by a process as claimed in claim 4 are leveled, before or after the polarization in the electric field and crosslinking, by applying a copolymer of methyl methacrylate and methacrylic acid, the methacrylic acid content of the copolymer being $>30$ mol %.

* * * * *